United States Patent
Masoodian et al.

(10) Patent No.: US 10,580,820 B2
(45) Date of Patent: Mar. 3, 2020

(54) HIGH-SENSITIVITY DEPTH SENSOR WITH NON-AVALANCHE PHOTODETECTOR

(71) Applicant: Gigajot Technology Inc., Pasadena, CA (US)

(72) Inventors: Saleh Masoodian, Pasadena, CA (US); Jiaju Ma, Pasadena, CA (US)

(73) Assignee: Gigajot Technology Inc., Pasadena, CA (US)

( * ) Notice: Subject to any disclaimer, the term of this patent is extended or adjusted under 35 U.S.C. 154(b) by 0 days.

(21) Appl. No.: 16/513,653

(22) Filed: Jul. 16, 2019

(65) Prior Publication Data

US 2020/0020735 A1  Jan. 16, 2020

Related U.S. Application Data

(60) Provisional application No. 62/698,805, filed on Jul. 16, 2018.

(51) Int. Cl.
   *H01L 27/146*  (2006.01)

(52) U.S. Cl.
   CPC .... *H01L 27/14643* (2013.01); *H01L 27/1464* (2013.01); *H01L 27/14614* (2013.01); *H01L 27/14616* (2013.01)

(58) Field of Classification Search
   CPC .......... H01L 27/1461; H01L 27/14614; H01L 27/14616; H01L 24/1464; H01L 27/14643
   See application file for complete search history.

(56) References Cited

U.S. PATENT DOCUMENTS

| 6,963,060 | B2 * | 11/2005 | Knee ................. H01L 27/14643 250/208.1 |
| 7,738,086 | B2 * | 6/2010 | Shepard ............. G01N 21/6408 356/317 |
| 8,253,810 | B2 * | 8/2012 | Myers ................ H04N 5/23248 348/208.1 |
| 8,686,367 | B2 | 4/2014 | Shah |
| 9,035,309 | B2 | 5/2015 | Park et al. |
| 9,171,985 | B2 | 10/2015 | Dutton et al. |
| 9,945,779 | B2 * | 4/2018 | Rothberg ........... G01N 21/6408 |

(Continued)

OTHER PUBLICATIONS

Fossum et al., "A Review of the Pinned Photodiode for CCD and CMOS Image Sensors," IEEE Journal of the Electron Devices Society, vol. 2, No. 3, May 2014, pp. 33-43.

(Continued)

*Primary Examiner* — Ngoc Yen T Vu
(74) *Attorney, Agent, or Firm* — Charles Shemwell

(57) ABSTRACT

A sensing device includes a light source to emit light, a light sensor to detect reflection of the emitted light and distance determination circuitry responsive to reflected-light detection within the light sensor. The light sensor includes a photodetector having a photocharge storage capacity in excess of one electron and an output circuit that generates an output signal responsive to light detection within the photodetector with sub-hundred nanosecond latency. The distance determination circuitry measures an elapsed time based on transition of the output signal in response to photonic detection within the photodetector and determines, based on the elapsed time, a distance between the sensing device and a surface that yielded the reflection of the emitted light.

21 Claims, 2 Drawing Sheets

(56) References Cited

U.S. PATENT DOCUMENTS

| | | |
|---|---|---|
| 10,312,275 B2 | 6/2019 | Hynecek |
| 2004/0021057 A1 | 2/2004 | Drowley |
| 2011/0202310 A1 | 8/2011 | Min et al. |
| 2016/0099283 A1 | 4/2016 | Khaliullin |

OTHER PUBLICATIONS

World Intellectual Property Organization (WIPO), International Search Report and Written Opinion dated Oct. 22, 2019 in International Application No. PCT/US2019/042091, 16 pages.

* cited by examiner

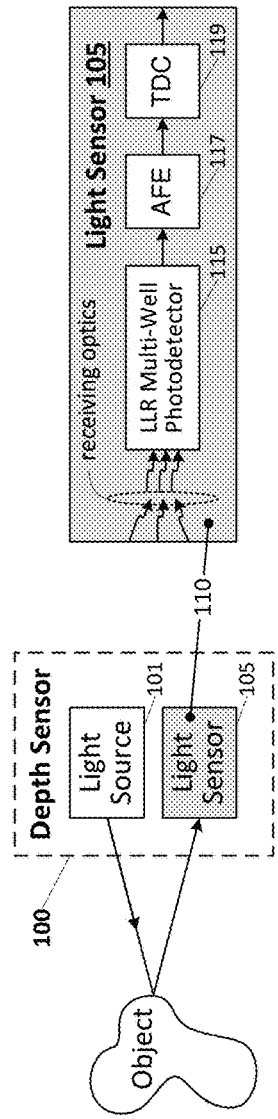
FIG. 1 3D Sensor/Depth Sensor with Low-Latency-Readout Photodetector
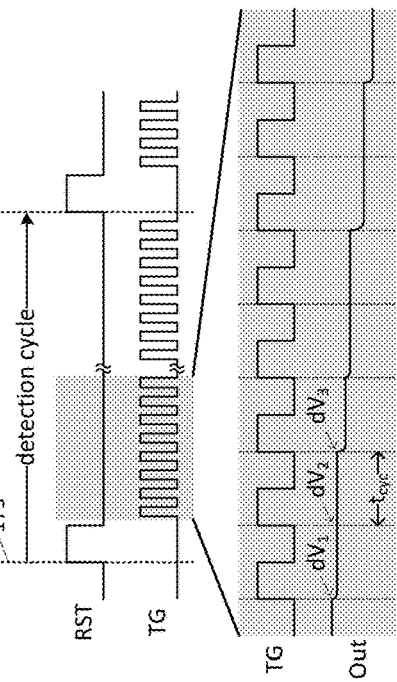
FIG. 2 PPD Photodetector with pinned floating diffusion node
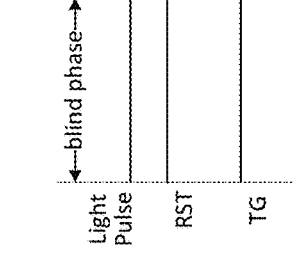
FIG. 4
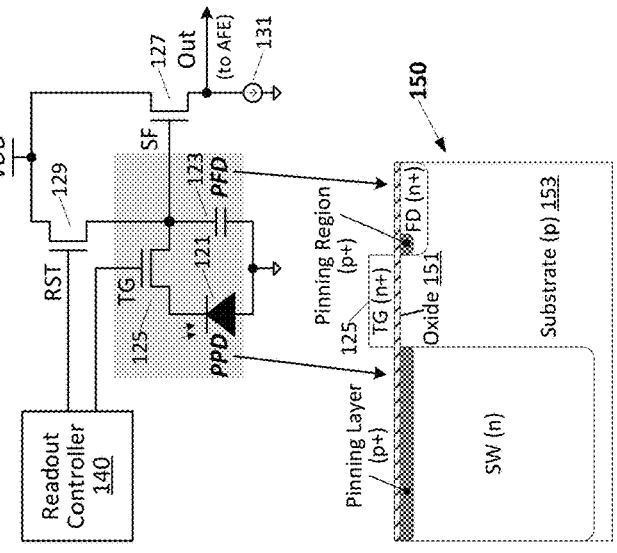
FIG. 3

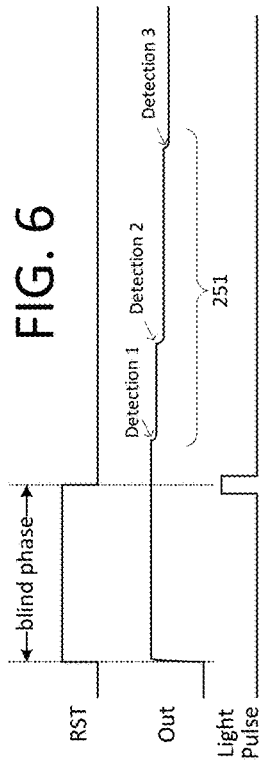
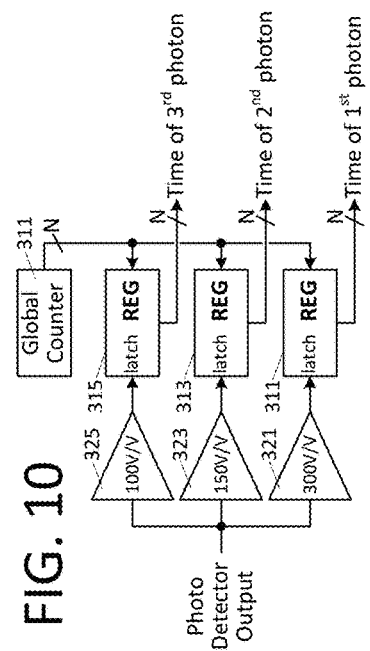
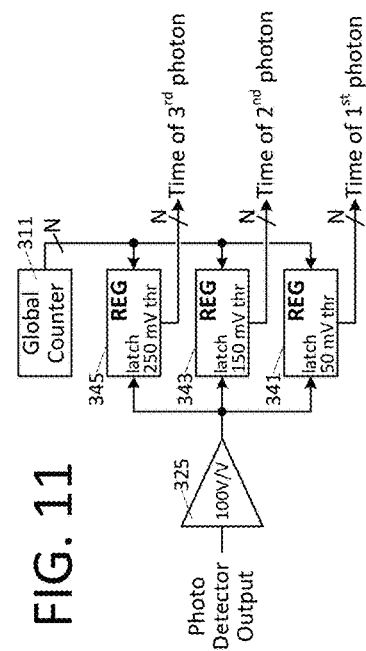
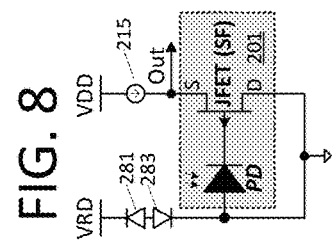
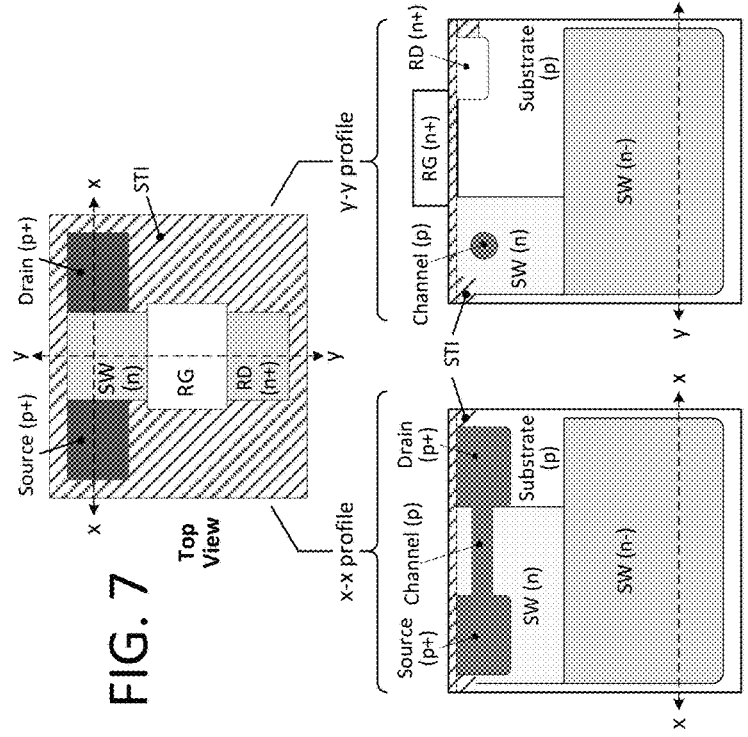

HIGH-SENSITIVITY DEPTH SENSOR WITH NON-AVALANCHE PHOTODETECTOR

CROSS-REFERENCE TO RELATED APPLICATIONS

This application hereby claims priority to and incorporates by reference U.S. provisional application No. 62/698,805 filed Jul. 16, 2018. This application also incorporates by reference U.S. application Ser. No. 15/301,267 (having 35 USC 371(c) date Sep. 30, 2016—now U.S. Pat. No. 10,319,776), Ser. No. 15/555,911 (having 35 USC 371(c) date Sep. 5, 2017—now U.S. Pat. No. 10,283,539) and 62/676,266 (filed May 24, 2018) and International Application Nos. PCT/US17/22607 (having international filing date Sep. 15, 2018) and PCT/US19/34036 (having international filing date May 24, 2019).

INTRODUCTION

A three-dimensional imager or depth sensor determines the depth in an object or the distance between the sensor and object generally by measuring either the time required for a light pulse (released from a light source near the sensor) to reflect off the object surface and return for detection by the sensor or by measuring envelope attenuation in the reflection of a carrier wave used to modulate a continuous light source (the attenuation being indicative of phase shift of the modulated carrier). In both pulse-based and phase-based sensing systems, the light sensor must be able to sense reflected light and register its magnitude and/or time of arrival with sufficient resolution to meet application accuracy requirements. For example, a light sensor in a pulse-based system intended measure a distance/depth with 5 mm accuracy will need to resolve the round-trip flight time of the light pulse to within ~33 picoseconds (ps) with sufficient low-light sensitivity to detect a weakly reflected pulse.

Conventional 3D imagers and depth sensors typically employ solid-state light sensors (photodetectors) with electron avalanche gain such as single-photon avalanche diodes (SPADs) and silicon photon multipliers (SiPMs). Although fast and sensitive to single photons, avalanche-gain photodetectors suffer from a number of drawbacks, including high dark current (i.e., noisy), single-electron well capacity, low quantum efficiency (QE), low spatial resolution, low manufacturing yield, etc. Other more robust photodetectors (i.e., having deeper photowells and/or higher QE, spatial resolution and manufacturing yield) have generally been avoided due to impractically long read-out latency. For example, in a sensor having a pinned photodiode (PPD) read-out by photocharge transfer to a floating diffusion node (e.g., as in a conventional four-transistor imaging pixel), the charge-transfer time alone is typically on the order of hundreds of nanoseconds (equivalent to a distance measurement resolution of hundreds of meters) and thus impractically latent for many depth-sensing applications.

TECHNICAL FIELD

The disclosure herein relates to solid-state light sensors that may be deployed in three-dimensional imagers or depth sensors.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of a depth sensor (or 3D sensor) having a light source and a low-latency, multi-photowell light sensor;

FIG. 2 illustrates an embodiment of the low-latency multi-photowell photodetector shown in FIG. 1;

FIG. 3 illustrates an exemplary detection cycle within the low-latency multi-well photodetector of FIG. 2;

FIG. 4 illustrates a photodiode reset sequence that may be executed after every detection cycle or every few detection cycles within the low-latency multi-well photodetector of FIG. 2;

FIG. 5 illustrates an embodiment of a low-latency multi-photowell photodetector having a JFET-based device that doubles as a multi-well photodiode and output transistor;

FIG. 6 illustrates an exemplary operational sequence within the JFET-based photodetector of FIG. 5;

FIG. 7 illustrates exemplary top and cross-sectional views of a p-type JFET transistor stacked vertically over a photodiode as in the FIG. 5 detector;

FIGS. 8 and 9 illustrate alternative JFET-based photodetector circuits;

FIG. 10 illustrates an embodiment of an analog front end/time-to-digital converter (AFE/TDC) having parallel amplification paths with stepped-down gains to trigger count-latching operations within respective registers at respective photon detection counts; and FIG. 11 illustrates an alternative AFE/TDC embodiment in which a single amplifier stage outputs an amplified photodetector output signal to latch inputs of registers having respective, progressively higher latching thresholds.

DETAILED DESCRIPTION

Light sensors having multi-carrier photowell depth and sub-nanosecond read-out latency (or latency not more than a few nanoseconds) are disclosed in various embodiments herein together with corresponding embodiments of analog front ends (AFEs) and time-to-digital converters (TDCs) that provide for rapid and/or resolute signal digitization. When deployed within a depth sensor or 3D sensor, the multi-photon sensitivity (i.e., multi-electron or multi-hole well depth) in combination with the low-latency readout and improved AFE/TDC enable dramatically improved depth sensing (higher sensitivity, finer resolution) relative to conventional avalanche-gain sensors.

FIG. 1 illustrates an embodiment of a depth sensor (or 3D sensor) 100 having a light source 101 and a low-latency, multi-photowell light sensor 105—that is, a light sensor with a photowell capable of storing multiple photocarriers (in contrast to single photocarrier avalanche-gain sensors) and generating a sensor output indicative of photocarrier accumulation (and thus incident photon strikes) either immediately as incident photon strikes occur or within a few nanoseconds (or less than a nanosecond) of a readout pulse. Referring to detail view 110, for example, light sensor 105 includes optional receiving optics to focus inbound (reflected) light onto a low-latency-readout (LLR) multi-well photodetector 115 which in turn outputs a detection signal via analog front end (AFE) 117 to time-to-digital converter (TDC) 119. The TDC output is supplied to back-end processing logic (not specifically shown) within depth sensor 100 which finalizes and outputs measurement data.

FIG. 2 illustrates an embodiment of the low-latency multi-photowell photodetector of FIG. 1, in this case having a pinned photodiode (PPD) 121 and pinned floating diffusion node (PFD) 123 interconnected by a gated channel (i.e., gated by transfer gate 125). A readout controller 140 asserts transfer-gate (TG) pulses at transfer gate 125 to form a charge-transfer channel between the PPD and PFD and thus transfer of photocharge accumulated within the photodiode to the pinned floating diffusion node for read-out via source-follower transistor 127. The pinning region within the floating diffusion counteracts TG pulse feedthrough to the floating diffusion node, avoiding the relatively long floating-diffusion settling time (delay before read-out) that plagues non-pinned floating diffusion structures and thus dramatically reduces the time between TG pulse assertion and settled output signal. In a number of embodiments, for example, the delay between TG pulse assertion and output signal settling (at the source terminal of transistor 127) is reduced from hundreds of nanoseconds to fewer than 100 nanoseconds and more generally fewer than 10 nanoseconds or five nanoseconds or less (e.g., 3, 2, or 1 nanoseconds or even sub-nanosecond intervals) and thereby reducing photodetector readout latency by two or more orders of magnitude. The pinned photodiode may be designed to have a photo-well of any practicable size (multi-photocarrier storage well, SW) and the floating diffusion node can likewise be sized to yield sufficiently high conversion gain (according to the ratio of PPD and PFD capacitance) and low input-referred read noise to enable photon-counting sensitivity. The source-follower transistor 127 is so named for its configuration within a source-follower circuit implemented by voltage-following action between the gate terminal (to which pinned floating diffusion node 123 is coupled) and source terminals of that transistor. More specifically, current source 131 establishes a constant bias current through transistor 127 to effect a steady-state gate-to-source voltage that causes the photodetector output at the source terminal of transistor 127 to follow the potential of the pinned floating diffusion node (at the gate of transistor 127)—that is, any change in the PFD potential will appear at the SF transistor source and thus in the signal output the AFE. Reset transistor 129 is provided to enable PFD and PPD reset, restoring the PFD node to VDD (in this example) when the readout controller asserts a reset pulse (RST) and restoring both the PFD and PPD storage nodes to VDD when the readout controller concurrently raises the RST and TG signals.

Still referring to FIG. 2, the p+ pinning region in the n+ floating diffusion may be sized as necessary to mitigate TG pulse feedthrough caused by TG-FD capacitance coupling. Referring to physical cross-section 150 (showing pinning-layer and storage well (SW) components of the pinned photodiode together with pinning region and capacitive storage (FD) regions of the pinned floating diffusion node), the transfer gate 125 (e.g., implemented by doped polysilicon) is disposed over a surface oxide to enable formation of an enhancement channel within substrate 153 between the PPD and PFD.

FIG. 3 illustrates an exemplary detection cycle within the low-latency multi-well photodetector of FIG. 2. At detection-cycle commencement (150), the readout controller asserts a reset pulse to reset the floating diffusion node—to VDD in this example—and then outputs a train of TG pulses to iteratively sample the charge accumulation level within the pinned photodiode. Each TG pulse enables transfer of collected (generated) photocharge from the storage well of the photodiode to the pinned floating diffusion node (i.e., any charge collected by the PPD since the previous TG pulse assertion will be transferred to the PFD and thereby change the PFD potential), with any such charge transfer yielding an output voltage step having a magnitude ($dV_1$, $dV_2$, $dV_3$) according to the number of transferred photocarriers. Note that the floating diffusion reset operation is executed only at the beginning of the light-detection cycle to recover the output voltage to a relatively high value (reset value)—in contrast to a conventional CMOS image sensor that resets the floating diffusion (asserts a RST pulse) prior to every charge-transfer event (i.e., prior to every TG pulse).

Within a depth sensor or 3D sensor, the AFE and TDC may record the photodetector output signal magnitude and timing following each TG pulse to enable back-end logic/computing circuitry to produce a time-of-flight-dependent depth measurement (e.g., ascertain a time at which the output signal falls below a detection threshold and apply that time in depth measurement computation). In general the detection resolution is constrained by the TG pulse cycle time ($t_{cyc}$), though the measurement generating logic may interpolate between voltage step-down events in successive pulse cycles to effect measurements with sub-$t_{cyc}$ resolution (e.g., modeling a linear photon strike profile over the duration of the detection cycle and using the coefficients of that linear profile to estimate a threshold crossing within a given $t_{cyc}$ interval).

FIG. 4 illustrates a photodiode reset sequence—simultaneous RST and TG signal assertion during an out-of-service "blind phase"—that may be executed after every detection cycle or every few detection cycles, the latter approach enabling an averaging of measurements captured along different photo-well fill points (i.e., potentially to correct for nonlinearity in charge transfer operations) and amortizing the blind-phase overhead over multiple detection cycles. In the example shown, a light pulse is emitted immediately upon conclusion of the photodiode reset operation (effectively an electrical shutter that may be used to clear thermally generated carriers and/or charge generated by ambient light) and TG pulse train output commences shortly or immediately thereafter (i.e., in accordance with a minimum depth measurement).

In alternative embodiments, transfer gate 125 and pinned floating diffusion node 123 may be omitted from the low-latency photodetector shown in FIG. 2 so that pinned photodiode 121 drives the gate of source-follower transistor 127 continuously. Such an arrangement yields a relatively instantaneous output in response to photonic detection as no charge transfer operation is required and thus may be applied in time-critical systems having relaxed sensitivity requirements.

FIG. 5 illustrates an alternative embodiment of the low-latency multi-photowell photodetector shown FIG. 1, in this case having a JFET-based device 201 that doubles as a multi-well photodiode (PD) 203 and source-follower transistor 205 to drive downstream signal processing logic. As shown in cross-section view 220, the source and channel of a depletion-mode JFET are implemented over a dual-region n-doped storage well (i.e., having n-doped region 221 and less heavily n-doped region 223) while the transistor drain is implemented over the p-type substrate in which the dual-region storage well is formed. The p-n junction between the p-type substrate and n-type storage well effectively constitute a photodiode installation beneath the JFET (i.e., a stacked JFET/PD structure). From a functional perspective, the drain of the JFET is internally connected to the substrate and biased to VSS (connection not shown), while the source of the JFET is coupled to constant current source 215 (itself coupled between VDD and the JFET source terminal). As photon strikes yield electron-hole pairs within the silicon, electrons (photocharge) are collected by the storage well and accumulate in the more heavily n-doped region (221) surrounding the JFET channel—modulating the electrostatic potential of the storage well and thus modulating the width of the depletion region in the channel as shown by the dashed-line depletion profiles at 230, effectively changing the channel resistance. Because the current through the channel is held constant by current source 215, the voltage on the source of the JFET follows the potential of the storage well (i.e., when the detector is biased in the saturation region) and is thus changes in proportion to the number of absorbed photons.

The JFET-based detector of FIG. 5 provides a number of advantages over pinned photodiode detection schemes. For one, no charge-transfer operation is required as absorbed photons yield instantaneous voltage change on the detector output, enabling higher temporal resolution and thus higher-precision depth measurement. The JFET-based detector may also exhibit higher conversion gain and lower input-referred readout noise than MOSFET-based detectors (e.g., pinned-photodiode-based detectors) due to a further reduced parasitic capacitance and voltage noise from the source follower, enabling single-photon sensitivity.

FIG. 6 illustrates an exemplary operational sequence within the JFET-based photodetector of FIG. 5. Initially an electrical shutter is applied during a blind phase by positively biasing (i.e., asserting RST to switch on) the reset gate—element 211 of FIG. 5—to clear (reset to VDD) the photodiode storage well. At conclusion of the blind phase, a light pulse is emitted to commence the depth sensing (and/or 3D imaging) operation. Thereafter, each photon strike yields a photo-electron capture within the storage well and thus a step-down of the output voltage as shown at 251. The timing and magnitude of the output voltage change will be recorded by the subsequent readout electronics (AFE/TDC circuitry) to enable generation of depth/distance/proximity measurements within back-end processing logic.

FIG. 7 illustrates exemplary top and cross-sectional views of a p-type JFET transistor stacked vertically over a photodiode as in the FIG. 5 detector. In the embodiment shown, the JFET-based detector includes a pair of (p+)-type heavily-doped source and drain regions, an n-type doped storage well (SW) for collection and storage of photoelectrons, a p-type doped channel interconnecting the source and drain regions, and an oxide-filled isolation trench (e.g., implemented using shallow-trench-isolation (STI) techniques, implantation-based isolation, etc.) to isolate the source region from the p-type substrate. A reset transistor is physically coupled to the storage well n-type region to conduct reset operation to the storage well, where the reset drain is constantly biased to a positive voltage higher than the threshold voltage of the transistor (e.g. VDD) and the reset operation can be asserted by positively biasing the reset gate. In alternative embodiments, a JFET-based detector is implemented with an n-type channel, reversing the doping polarity in each region while maintaining the relative doping concentration.

FIGS. 8 and 9 illustrate alternative JFET-based photodetector circuits. In the FIG. 8 embodiment, gateless reset is achieved using punch-through diodes 281, 283—The punch-through diode forms a npn junction with the photodiode n-type doping well. It conducts reset operation for the photodiode by positively pulsing the reset drain n-well. Compared to the conventional reset transistor approach, it provides less parasitic capacitance between the reset gate and the voltage output node (e.g. photodiode or floating diffusion) and hence yielding higher conversion gain and lower input-referred read noise. In the FIG. 9 embodiment (which may be implemented with gateless reset or with the gated reset arrangement shown in FIG. 5), the JFET is biased to function as a common-source amplifier (instead of the common-drain source-follower arrangement shown in FIG. 5) to boost the detector gain. More specifically, a constant current source is coupled between drain and VSS (which may be ground) to bias the JFET drain potential, while a resistance-control transistor 291 (RES) is coupled between the JFET source and VDD to bias the JFET source terminal.

As mentioned above, avalanche-gain photodetectors such as SPADs and SiPMs have only single-electron (photon) well capacity and thus saturate after each detected photon and require reset before the next detection. The limited capacity restricts the capabilities of the detector. For example, if the full-well capacity (FWC) is higher than one electron, as in the case of the pinned-photodiode and JFET-based photodetectors described above, light intensity information can be acquired during the detection cycle and used for more informative/descriptive measurement—for example, detecting reflectance coefficients and textures of sensed objects. More specifically, the pinned-photodiode and JFET-based photodetectors described herein may be implemented with well capacities well beyond a single photoelectron—for example, 2, 3, 5, 10, 100, 1000 or more photoelectron well-depths or more (or any well depth between those limits) and thus yield output signals that change progressively throughout/within a given light-detection cycle (e.g., as shown in FIGS. 3 and 6). In a number of embodiments, AFEs and TDCs capable of capturing the intra-detection-cycle arrival time and intensity information corresponding to successive photon reception events occurring prior to photodetector saturation (including events or sub-intervals in which more than one photoelectron is captured) are coupled with such multi-well low-latency photodetectors to enable high-speed readout of such intra-cycle information.

In a number of sensor system embodiments, a high-bandwidth, low-noise gain stage is implemented within the analog front end (AFE) to amplify the low-latency photodetector output signal and prepare the signal for the high-speed digitization, enabling high-sensitivity/high-resolution depth measurement that leverages the additional sensory data made available by the multi-carrier photowell. In general, the required AFE gain is application specific and depends on the conversion gain of the detector and the photowell depth. In applications requiring relatively low temporal resolution and high sensitivity (i.e., long-distance/high-spatial-resolution depth measurement) for example, low-latency CMOS photodetectors having extremely low read noise (e.g., CMOS photodetectors having a pinning region in the floating diffusion as discussed above) and pump-gate jots (i.e., as described in U.S. application Ser. No. 15/301,267) can be used. Charge transfer amplifiers (CTAs) can be used to readout these photodetectors (pixels). Stacked structures can also be used to increase the bandwidth of the in-pixel amplifier. For example, a cluster-parallel architecture can be implemented as explained in International application PCT/US17/22607. In any case, after amplification by the analog front end, the photodetector output signal can be buffered by one or more inverters (as necessary) and applied to a TDC (e.g., a counter and circuit to latch the counter output upon detecting an AFE output above a predetermined or programmed threshold).

FIG. 10 illustrates an embodiment of an AFE/TDC having parallel amplification paths with stepped-down gains to trigger latching operations within respective registers—i.e., latching the output of a global counter 310 and thus a measure of time transpired—at respective photon detection counts. For example, when coupled between a photodetector having a 1 mV/e-conversion gain and registers 311, 313, 315 having a 300 mV trigger threshold (i.e., latch signal at or above 300 mV will trigger a latching operation within the register, thereby recording the global count at the triggered point in time), the gains of amplifiers 321, 323, 325 are set to 300× (300 volts per volt or 300V/V), 150× and 100×, respectively. By this operation, a single photon detection (collection of a single photoelectron within the photodiode storage well) will produce, via amplifier stage 321, a latch-triggering signal (300 mV) at the input of latch 311 to capture the time of the detection event (i.e., latch the output of the global counter in response to the first photon detection). The lower gain levels within amplifier stages 323 and 325 will yield under-threshold output signals (150 mV and 100 mV) at the latch inputs of registers 313 and 315 so that those registers remain armed and available to latch subsequent global-count values. Accordingly, upon detection of a second photon, the photodetector output signal doubles from 1 mV to 2 mV, thus yielding a 300 mV output from amplifier stage 323 to trigger a count-latching operation within register 313 to capture the time (global count) of the second photon detection event. The photodetector increments by another mV (to 3 mV) upon detection of a third photon to yield a 300 mV output from amplifier stage 325 and thus latch the global count (and time of third photon detection) within register 315. Additional AFE gain stages and TDC registers may be provided in alternative embodiments to generate TDC outputs (global count value capture) with respect to subsequent photon detection events up to the well depth (saturation level) of the photodetector. Also, light sensors having an array of photodetectors (pixels in an array) may include a corresponding array of the AFE/TDC unit shown in FIG. 10 (a single global counter may be provided to yield the elapsed-time count for the entire array).

FIG. 11 illustrates an alternative AFE/TDC embodiment in which a single amplifier stage outputs an amplified photodetector output signal to latch inputs of registers having respective and progressively higher latching thresholds. Continuing with the exemplary 1 mV/e-conversion-gain photodetector, an amplifier stage 325 having a 100V/V gain drives the latch inputs of registers 341, 343 and 345, having respective 50 mV, 150 mV and 250 mV latch-trigger thresholds. By this arrangement, a single photon detection will produce a 100 mV amplifier output and thus trigger a count-latching operation within register 341 (i.e., the 100 mV output from amplifier 325 exceeds the 50 mV latching threshold of register 341, but not the 150 mV and 250 mV thresholds of registers 343 and 345). A second photon detection will latch the output of global counter 311 within register 343 (i.e., amplifier 325 will generate a 200 mV output that exceeds the 150 mV latching threshold of register 343) and a third photon detection will latch the global-count within register 345 (i.e., 300 mV output from amplifier >250 mV latching threshold of register 345). As with the embodiment of FIG. 10, additional TDC registers with progressively higher latching thresholds may be provided in alternative embodiments to generate TDC outputs (global count value capture) with respect to subsequent photon detection events up to the well depth (saturation level) of the photodetector. Also, light sensors having an array of photodetectors may include a corresponding array of the AFE/TDC unit shown in FIG. 11 (though a single global counter may be provided to yield the elapsed-time count for the entire AFE/TDC array).

The AFE/TDC circuits illustrated in FIGS. 10 and 11—the amplifier stage(s) in particular—may be implemented in a stacked process to increase the fill-factor of the photodetector IC and/or reduce the length (and thus the parasitic capacitance) of the photodetector output line (e.g., a column output line) to increase the bandwidth of the AFE/TDC circuitry. In such stacked multi-well (non-avalanche) depth-sensing sensor, the entirety or any portion of the readout circuitry (including AFE/TDC) may be co-located on the same integrated circuit chip as the photodetector cell(s). Alternatively, the readout circuitry may be disposed in whole or part on a logic chip bonded or otherwise mounted in a stacked configuration with a sensor chip bearing the photodetector cells (e.g., wafer bonding of a first wafer containing readout circuitry with a second wafer containing photodetectors, followed by singulation into two-die stacks in which an exposed exterior surface of the photodetector chip constitutes a backside illumination surface).

The various detectors, readout circuitry and physical configurations disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific threshold levels, amplification levels, conversion gains, component counts, interconnect topologies, sensor implementations, component elements and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). The term "coupled" is used herein to express a direct connection as well as a connection through one or more intervening functional components or structures. Device configuration or programming can include, for example and without limitation, loading a control value into a register or other storage circuit within an integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device (e.g., amplification factor, latching threshold, etc.). The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A sensing device comprising:
    a light source to emit light;
    a light sensor to detect reflection of the light emitted by the light source, the light sensor having a photodetector with a photocharge storage capacity in excess of one electron and an output circuit to generate an output signal that transitions between voltage levels in response to and within 100 nanoseconds of photonic detection, within the photodetector, of the reflection of the light emitted by the light source; and
    circuitry to measure an elapsed time based on the output signal transition in response to the photonic detection and to determine, based on the elapsed time, a distance between the sensing device and a surface that yielded the reflection of the light emitted by the light source.

2. The sensing device of claim 1 wherein the circuitry to measure the elapsed time comprises circuitry to measure an elapsed time between emission of the light from the light source and the output signal transition in response to the photonic detection.

3. The sensing device of claim 2 wherein the light source to emit light comprises a light source that emits a light pulse and wherein the circuitry to measure the elapsed time comprises circuitry to measure an elapsed time between emission of the light pulse from the light source and the output signal transition in response to the photonic detection.

4. The sensing device of claim 2 wherein the measurement circuitry to measure the elapsed time comprises a counter that increments or decrements a count output over time in response to transitions of a clock signal and latching circuitry to latch the counter output in response to the transition between voltage levels in the output signal.

5. The sensing device of claim 1 wherein the output circuit to generate the output signal that transitions between voltage levels in response to and within 100 nanoseconds of photonic detection comprises circuitry to transition the output signal between voltage levels within 10 nanoseconds of photonic detection within a photodiode of the photodetector.

6. The sensing device of claim 1 wherein the photodetector comprises a pinned photodiode, a floating diffusion node having a pinned region therein, and a transfer gate to enable formation of a conductive channel between the pinned photodiode and the floating diffusion node.

7. The sensing device of claim 6 wherein the output circuit comprises a metal-oxide-semiconductor (MOS) transistor having a gate terminal coupled to floating diffusion node and a signal output terminal to generate, as the output signal that transitions between voltage levels within 100 nanoseconds of photonic detection, a voltage that transitions in response to changes in the potential of the floating diffusion node.

8. The sensing device of claim 1 wherein the photodetector comprises a photodiode having a photowell and wherein the output circuit comprises a junction field-effect-transistor (JFET) having a channel disposed adjacent the photowell of the photodiode.

9. The sensing device of claim 8 wherein the JFET comprises doped source and drain regions electrically exposed at a surface of a semiconductor substrate and interconnected by a conduction channel, and wherein the photodiode extends more deeply below the surface of the semiconductor substrate beneath conduction channel.

10. The sensing device of claim 9 wherein conductivity of the conduction channel of the JFET varies as photocharge is accumulated within the photowell of the photodiode.

11. The sensing device of claim 8 wherein the JFET comprises doped source and drain regions electrically exposed at a surface of a semiconductor substrate and interconnected by a conduction channel, and wherein the photodetector further comprises an oxide trench to electrically isolate the JFET from the semiconductor substrate.

12. The sensing device of claim 1 wherein the output circuit to generate the output signal comprises circuitry to generate an output signal that transitions between voltage levels in within 5 nanoseconds of photonic detection of the reflection of the light emitted by the light source.

13. The sensing device of claim 1 wherein the output circuit to generate the output signal comprises circuitry to generate an output signal that transitions between voltage levels in within 1 nanosecond of photonic detection of the reflection of the light emitted by the light source.

14. The sensing device of claim 1 wherein the photodetector included within the light sensor comprises a first photodetector and wherein the light sensor additionally includes a plurality of other photodetectors each having respective storage capacities in excess of one electron, and wherein the first photodetector and plurality of other photodetectors are collocated within a two-dimensional array.

15. A method of operation within a sensing device, the method comprising:
    emitting light from the sensing device;
    detecting reflection of the emitted light within a photodetector having a photocharge storage capacity in excess of one electron;
    generating an output signal that transitions between voltage levels in response to and within 100 nanoseconds of detection of the reflection of the emitted light within the photodetector;
    measuring an elapsed time based on the output signal transition in response to the photonic detection;
    determining, based on the elapsed time, a distance between the sensing device and a surface that yielded the reflection of the light emitted by the light source.

16. The method of claim 15 wherein measuring the elapsed time comprises measuring an elapsed time between emission of the light from the light source and the output signal transition in response to the photonic detection.

17. The method of claim 16 wherein emitting light from the sensing device comprises emitting a light pulse from the sensing device and wherein generating the measure of elapsed time comprises generating a measure of elapsed time between emission of the light pulse from the sensing device and photonic detection within the photodetector of a reflection of the light pulse emitted.

18. The method of claim 15 wherein generating the output signal that transitions between voltage levels in response to and within 100 nanoseconds of detection of the reflected light comprises generating an output signal that transitions between voltage levels within 10 nanoseconds in response to and within 10 nanoseconds of detection of the reflected light.

19. The method of claim 15 wherein detecting reflection of the emitted light within the photodetector comprises accumulating photocharge within a pinned photodiode and wherein generating the output signal comprises (i) transferring the photocharge from the pinned photodiode to a floating diffusion node having a pinning region therein and (ii) generating the output signal according to a voltage level of the floating diffusion node after transferring the photocharge from the pinned photodiode to the floating diffusion node.

20. The method of claim 15 wherein detecting reflection of the emitted light within the photodetector comprises accumulating photocharge within a photodiode disposed adjacent a channel of a junction field-effect-transistor (JFET), and wherein generating the output signal comprises generating the output signal at a terminal of the JFET coupled to the channel, the output signal having a voltage level according to amount of photocharge accumulated within the photodiode.

21. A sensing device comprising:
   means for emitting light;
   means for detecting reflection of the emitted light, the means for detecting having a photocharge storage capacity in excess of one electron;
   means for generating an output signal that transitions between voltage levels in response to and within 100 nanoseconds of detection of the reflection of the emitted light within the means for detecting;
   means for measuring an elapsed time based on the output signal transition in response to the photonic detection;
   means for determining, based on the elapsed time, a distance between the sensing device and a surface that yielded the reflection of the light emitted by the light source.

* * * * *